United States Patent
Kim

Patent Number: 5,740,603
Date of Patent: Apr. 21, 1998

[54] METHOD FOR MANUFACTURING LOW DIELECTRIC CONSTANT MULTIPLE LAYER CERAMIC CIRCUIT BOARD

[75] Inventor: Chul-Ho Kim, Kyongki-do, Rep. of Korea

[73] Assignee: Samsung Electro-Mechanics Co., Ltd., Suwon, Rep. of Korea

[21] Appl. No.: 687,838

[22] Filed: Jul. 26, 1996

[30] Foreign Application Priority Data

Jul. 31, 1995 [KR] Rep. of Korea ............... 1995-23552
Jul. 31, 1995 [KR] Rep. of Korea ............... 1995-23553

[51] Int. Cl.$^6$ ............... H05K 1/03; H05K 1/14
[52] U.S. Cl. ............... 29/830; 29/848; 29/851; 29/852
[58] Field of Search ............... 29/830, 840, 850, 29/851, 852, 848, 853, 887, 616, 617; 264/61; 428/901; 501/32

[56] References Cited

U.S. PATENT DOCUMENTS

| | | | |
|---|---|---|---|
| 4,935,584 | 6/1990 | Boggs | 29/830 X |
| 5,073,180 | 12/1991 | Farooq et al. | 29/830 X |
| 5,196,384 | 3/1993 | Kamezaki et al. | 501/32 |
| 5,480,503 | 1/1996 | Casey et al. | 29/830 X |
| 5,481,795 | 1/1996 | Hatakeyama et al. | 29/830 X |

FOREIGN PATENT DOCUMENTS

2-116196  4/1990  Japan .

OTHER PUBLICATIONS

Abstracted JP 2–116,196 in English (Published Apr. 27, 1990).

*Primary Examiner*—Horace M. Culver
*Attorney, Agent, or Firm*—Ladas & Parry

[57] ABSTRACT

A method for manufacturing multiple circuit board for mounting LIS elements and general electronic elements, and which is direcdted to provide a method for manufacturing a porous multiple layer ceramic circuit board in which a granularity of lead-zinc-borate glass (Pb—Zn—B glass) powder mixed together with ceramic powder is classified into two kinds and then the powders classified with granularity is used, so that closed pores of suitable magnitude and quantity are formed within interior even without addition of high molecular open gap type raw material whereby an insulation property and wetproof property are excellent and dielectric constant is low. The invention is made such that only A green sheets are piled by printing a conductor electrode to A green sheet manufactured by mixing 30–70 wt % of ceramic powder and Pb—Zn—B glass powder made of 50–90 wt % of powder being 9–20 wt % in average granular diameter and 10–50 wt % of powder being less than 3 μm in average granular diameter, or else A/B green sheets are alternately piled after printing a conductor circuit to B green sheet used with said A green sheet and calcium silicate crystallized powder, and then pressure heat sealed, and the pressure heat sealed sheet is de-bound and thereafter fired.

12 Claims, 4 Drawing Sheets

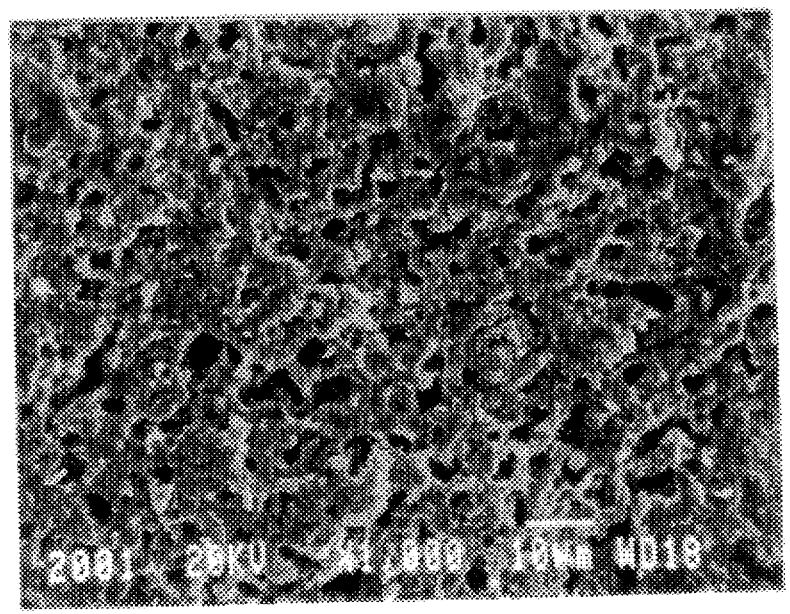
F I G. 4
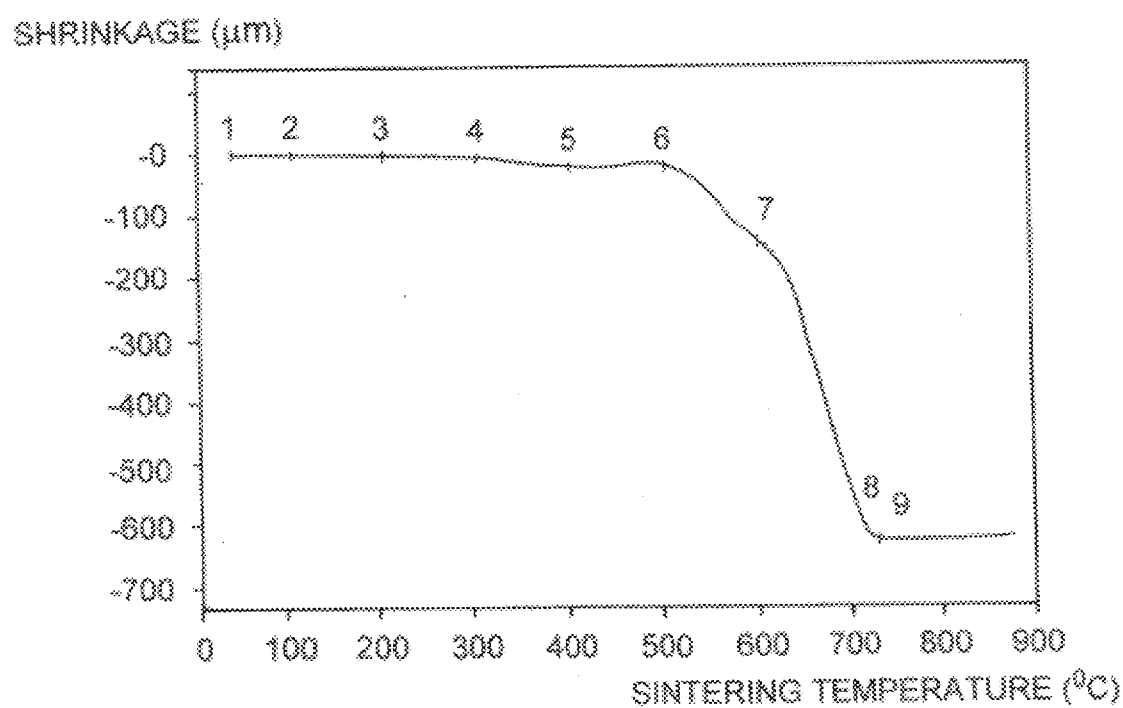
F I G. 5

METHOD FOR MANUFACTURING LOW DIELECTRIC CONSTANT MULTIPLE LAYER CERAMIC CIRCUIT BOARD

BACKGROUND OF THE INVENTION

The present invention relates to a method for manufacturing multiple circuit board for mounting LIS elements and general electronic elements, and more particularly to a method for manufacturing porous multiple layer ceramic circuit board being excellent in insulation property and wetproof property and having low dielectric constant by introducing suitable closed pores within interior.

Recently, in accordance with tendency making to high integration, minuteness, and high speed of semiconductor element, high density wiring, high speed transmission of signal, making to higher frequency and high heat diffusion are required for a circuit board for mounting.

$Al_2O_3$ circuit board having been used in past has to be fired at high temperature of 1500° C., and in a high speed transmission of synchronous signal at high temperature, a uppermost limit is exposed in dielectric constant of said material, electric resistance of conductor wiring, and high speed transmission of synchronous signal. And since a recently developed low temperature fired multiple layer ceramic circuit board is low in dielectric constant and uses an insulation material firing at low temperature below 1000° C., Au, Ag, Cu and the like being low in electric resistance can be used as a conductor wiring material, and it is possible to see somewhat satisfied in high speed transmission and high density mounting. In a high speed transmission of electric signal, a transmission delay time of signal is proportional to square root ($\sqrt{\epsilon}$) of dielectric constant of using circuit board, and it is very important to decrease the dielectric constant of the circuit. The dielectric constant of $Al_2O_3$ circuit board is approximately 10, and a recently developed low firing ceramic circuit board is not possible to see also that it is sufficient in dielectric constant (measure of approximately 9–4), and it is a situation that an improvement for this is required.

On the other hand, as an effective method for decreasing dielectric constant of the circuit board, a method for introducing pore to the circuit board can be cited. That is, since a dielectric constant of air is 1, the dielectric constant of porous ceramic circuit board can be expressed by following expression (1):

$$\log \epsilon = (1-P) \log \epsilon_\theta \quad (1)$$

wherein, $\epsilon$ is a dielectric constant of porous circuit board, $\epsilon_\theta$ is dielectric constant peculiar to material, and P is porous rate of the circuit board. In accordance with above expression (1), the dielectric constant of the circuit board is decreased in response to increasing of P, and it is possible to see that an introducing of pore to the circuit board is most effective for increasing a strength of the circuit board. However, an excessive pore introduction to the circuit board decreases a strength of the circuit board and in case where the pores are made to be open pores, an insulation property and wetproof property of the circuit board are weakened. Accordingly, it is very important to form suitable isolated closed pores within the circuit board.

On the other hand, as a method for lowering the dielectric constant by forming suitable isolated closed pores within the circuit board, a method being offered in Japanese laid open patent publication Hei-2-116196 can be cited, and according to this method, a high molecular open gap type material should be necessarily added for forming the closed pores. Accordingly, in accordance with above described conventional method, since uniform mixture is difficult to be occurred according to density difference of said high molecular open gap type material whereby uniform dispersion is difficult to be made, there had been a problem being difficult to obtain a uniform spreading of the pores.

And since said high molecular open gap type material should not be dissolved to organic binder, there has been a problem that not only a selection of the high molecular open gap type material receives a limitation but a process for manufacturing the high molecular open gap type material also difficult.

OBJECT AND SUMMARY OF THE INVENTION

Therefore, this inventor has had a research and experiment for solving problems of above described techniques, and this invention is offered based on its result, and it is an object of the present invention to provide a method for manufacturing a porous multiple layer ceramic circuit board in which a granularity of lead-zinc-borate glass Pb—Zn—B glass) powder mixed together with ceramic powder is classified into two kinds and then a green sheet obtained by pertinently adjusting a mixing ratio of the powders classified with granularity is fired at low temperature, so that closed pores of suitable magnitude and quantity are formed within interior even without addition of high molecular open gap type raw material whereby an insulation property and wetproof property are excellent and dielectric constant is low.

Another object of the present invention is to provide a method for manufacturing a porous multiple layer ceramic circuit board in which a green sheet made as above and a green sheet made by using calcium silicate crystallized glass powder are alternately piled and then fired at low temperature, so that closed pores of suitable magnitude and quantity are formed even without addition of high molecular open gap raw material whereby not only an insulation property and wetproof property are excellent and dielectric constant is low but bending and folding strength is also excellent.

In order to attain such objects as above, a method for manufacturing multiple ceramic layer circuit board of the present invention comprises:

a step for mixing 30–70 wt % of Pb—Zn—B glass powder made of 50–90 wt % of a powder being 9–20 µm of average granular diameter and 10–50 wt % of a powder of less than 3 µm of average granular diameter, and 30–70 wt % of ceramic powder;

a step for manufacturing slurry of less than 3000 cps in viscosity by uniformly dispersing the mixture mixed as above and an organic binder into solvent;

a step for forming a green sheet by casting said slurry;

a step for forming a though hole at a predetermined position of said green sheet and then, injecting a conductor electrode, and printing a conductor electrode on sheet surface;

a step for heat-sealing after piling a circuit board printed with conductor electrode; and a step for firing at 650°–750° C. after de-binding the heat-sealed sheet.

And, the method for manufacturing multiple layer ceramic circuit board of the present invention comprises:

a step for forming a green sheet by mixing Pb—Zn—B glass powder and ceramic powder as above, and then forming a through hole at a predetermined position of said green sheet;

a step for manufacturing a slurry less than 3000 cps in viscosity by uniformly dispersing calcium silicate crystallized glass powder and glass binder into solvent, and then forming a green sheet as above, and forming a through hole at a predetermined position of the green sheet;

a step for injecting a conductor electrode to each through hole formed as above, and printing the conductor electrode on each sheet surface;

a step for alternately piling the sheets printed with conductor electrode as above; and a step for de-binding the sheet being heat-sealed as above and then firing at 750°–900° C.

BRIEF DESCRIPTION OF THE DRAWINGS

FIG. 4 is a SEM photograph for a broken end surface of the multiple layer ceramic circuit board manufactured in accordance with the present invention, FIG. 5 is a SEM photograph for a broken end surface of another multiple layer ceramic circuit board manufactured in accordance with the present invention.

DETAILED DESCRIPTION OF PREFERRED EMBODIMENTS

Hereinafter, a preferred embodiment of the present invention will be described more in detail with reference to the accompanying drawings.

Figure 1:
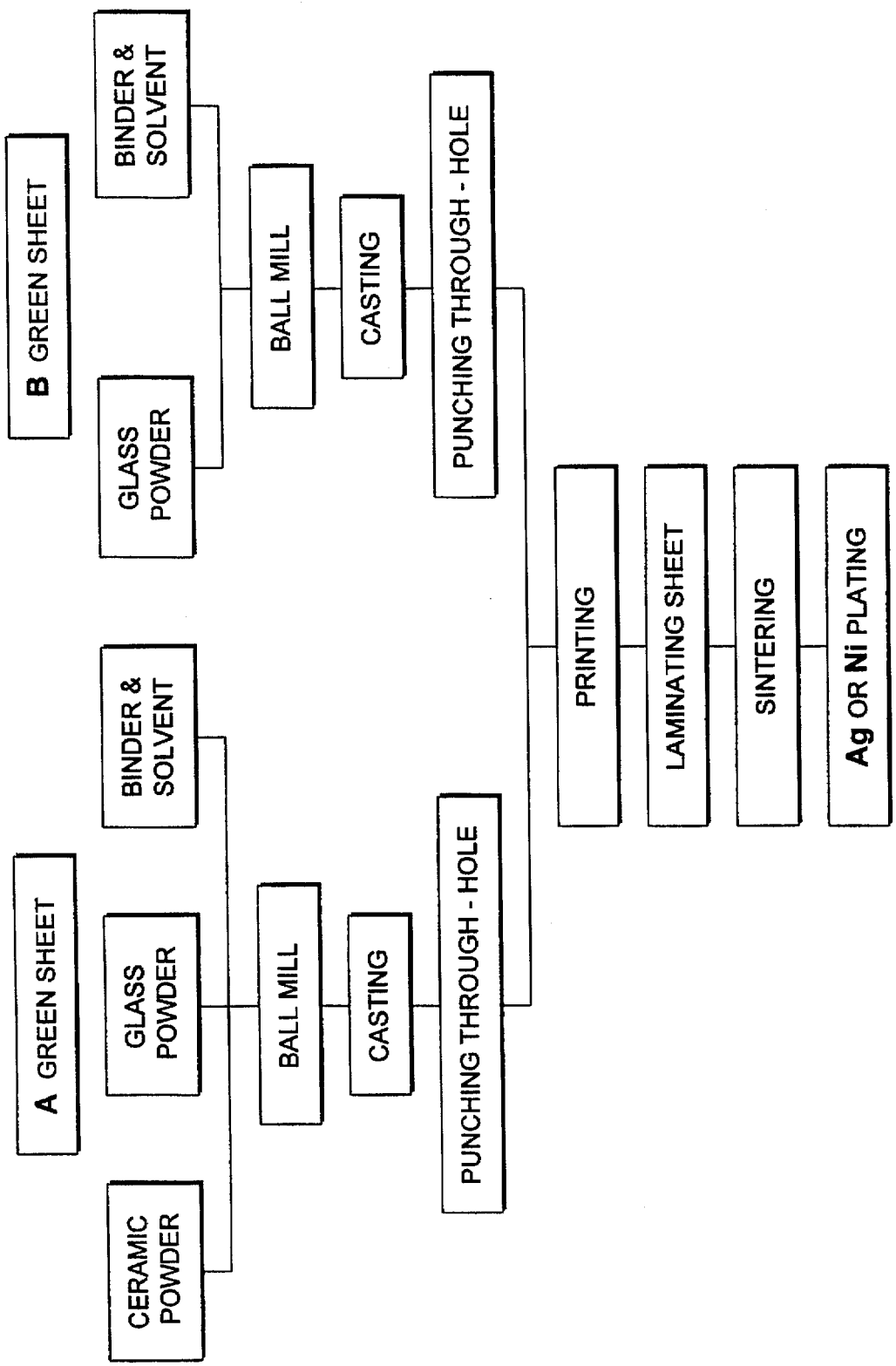
FIG. 1 is a schematic diagram of process for manufacturing multiple layer ceramic circuit board manufactured in accordance with the present invention.

In order to manufacture the multiple layer ceramic circuit board in accordance with the present invention, as in FIG. 1 which schematically shows a manufacturing process of the present invention, firstly a ceramic powder such as $Al_2O_3$ powder and Pb—Zn—B glass powder are mixed.

Adding quantity of above ceramic powder is desirable to limit to 30–70 wt %, and its reason is because in case the adding quantity is less than 30 wt %, not only a strength of the circuit board is decreased but there would be a worry to be deformed, and in case of more than 70 wt % as well, the strength would be decreased.

And, with above Pb—Zn—B glass powder, a first powder being 9–20 μm of average granular diameter and a second powder being a less than 3 μm of average diameter are used together, and it is desirable to limit a quantity of said first powder to 10–50 wt % and a quantity of said second powder to 50–90 wt %, and its reason is as follows.

In case where an average granular diameter of the first powder is less than 9 μm, a pore magnitude becomes smaller whereby a decreasing effect of the dielectric constant is less, and in case of more than 20 μm, the pore magnitude becomes too bigger whereby a strength of the circuit board becomes decreased, therefore an average granular diameter of the first powder is desirable to limit to 9–20 μm.

And, in case where the average granular diameter of the second powder is more than 3 μm, since smaller pore after firing is formed whereby density is decreased and strength is lowered, the average granular diameter of the second powder is desirable to limit to less than 3 μm.

And, in case where a quantity of the first powder is less than 10 wt %, big pore numbers are decreased, and in case of more than 50 wt %, the strength of the circuit board becomes decreased, therefore the quantity of the first powder is desirable to limit to 10–50 wt %, and more preferably 30–50 wt %.

Next, a mixed powder mixed as above is uniformly dispersed into solvent together with organic binder whereby a slurry less than 3000 cps is manufactured.

As an organic binder, PVA, PVB and acryl resin are desirable.

In case where a viscosity of said slurry is more than 3000 cps, a fluidity is bad upon casting of green sheet whereby shape defect and surface defect are produced, therefore the viscosity of the slurry is preferable to limit to less than 3000 cps.

Next, the slurry manufactured as above is casted by a doctor blade film making method and the like whereby A green sheet of a thickness adapted to usage is formed.

At this moment, in case when a multiple layer ceramic circuit board is manufactured by utilizing only said A green sheet, a through hole is formed at a predetermined position of the A green sheet, and then a conductor electrode such as Ag is injected by a screen printing method and the like whereby a conductor electrode such as Ag is printed on the sheet surface.

Above described heat sealing process is executed by ordinary method, and preferably it is executed by a pressure of about 2000 psi at about 80° C.

Next, when the sheet being heat sealed as above is bound and then fired at 650°–750° C., closed pores of suitable magnitude and quantity are formed within interior even without addition of high molecular open gap type raw material whereby a porous multiple layer ceramic circuit board in which an insulation property and wetproof property are excellent and dielectric constant is low is manufactured.

In case when said firing temperature is less than 650° C., not only a melting is not occurred whereby a making to minuteness is not made but also coarse and big pores are formed, and in case of more than 750° C., the temperature is too high whereby a viscosity of glass being a liquid phase becomes too low upon firing whereby there would be a worry for generating a deformation of the circuit board, therefore the firing temperature is preferable to limit to 650°–750° C.

As will be able to know at above, in the present invention, in order to form the closed pores, at a time when a glass powder contained with big particles being same constituent in constant ratio and the ceramic powder are mixed and fired in liquid phase at a temperature more than glass melting point whereby big glass particle is heated in melting state, the melted liquid is sucked by capillary force of gap among ceramic particles around the big particles, so that the closed pores are formed at a position of big glass particles whereby a dielectric constant of the circuit board becomes to be lowered. Accordingly, a magnitude of the pore is possible to control by a magnitude of big glass particle, and the pore rate of entire circuit board is possible to control by a containing quantity of big glass particle.

Figure 2:
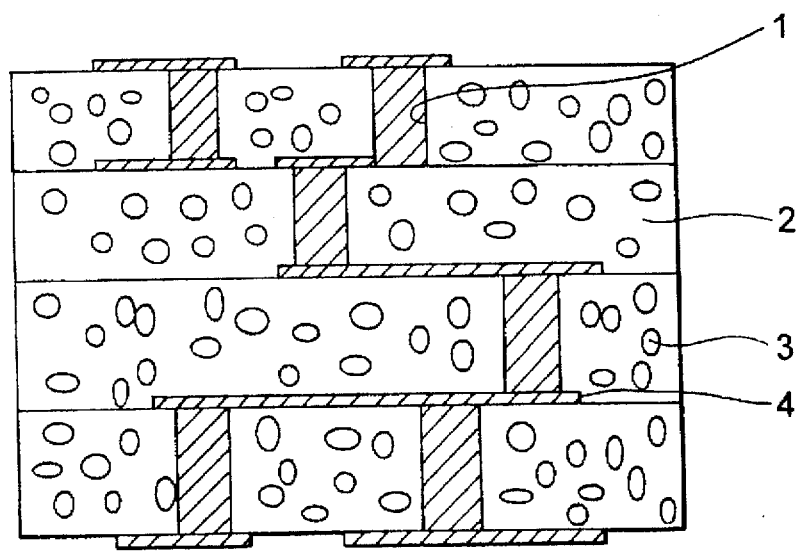
FIG. 2 is a cross sectional facsimile diagram of multiple layer ceramic circuit board manufactured in accordance with the present invention.

A facsimile diagram of multiple porous multiple layer ceramic circuit board manufactured by utilizing only A green sheet in accordance with the present invention is shown in FIG. 2. In FIG. 2, a reference numeral symbol 1 represents through hole, a numeral 2 is ceramic fired material, a numeral 3 is an isolated closed pore, and a numeral 4 is conductor electrode.

On the other hand, when A green sheet manufactured at above and B green sheet manufactured by a calcium silicate crystallized glass powder of minute structure are alternately piled, a circuit board being not only low in dielectric constant but also a bending and folding strength is high is obtained. Firstly, a through hole is formed at a firing position of A green sheet manufactured as FIG. 1, and then calcium silicate crystallized glass powder and a glass binder are uniformly dispersed into solvent whereby a slurry being less than 3000 cps in viscosity is manufactured, and thereafter B green sheet is formed and a through hole is formed at a firing position of B green sheet.

Next, a conductor electrode such as Ag is injected to said respective through hole by a screen printing method, and the conductor electrode such as Ag is printed on said each sheet surface.

Above described heat sealing process is executed by an ordinary method, and preferably executed by a pressure of about 2000 psi at about 80° C.

Next, the sheet being heat sealed as above is debound, and then fired at 750°–900° C., so that multiple layer ceramic circuit board is manufactured.

In case where said firing temperature is less than 750° C., the glass is not melted whereby not only a making to minuteness is not occurred but also coarse and big pore is not formed, and in case of more than 900° C., the temperature is too high whereby the viscosity of glass being a liquid phase upon firing is too high and thereby there would be a worry for generating a deformation of the circuit board, therefore said firing temperature is preferable to limit to 750°–900° C.

And, in above described method, its manufacturing condition is preferable to be so adjusted that multiple ceramic circuit board containing 10–40 vol % of isolated pore being 5–30 µm in diameter is manufactured.

As will be able to know at above description as well, in case of manufacturing method also which fires in liquid phase at a temperature more than a glass melting point by alternately piling A green sheet manufactured by mixing Pb—Zn—B glass powder containing big particle being same constituent at constant ratio and a ceramic powder and B green sheet of calcium silicate crystallized glass powder, at a time when big glass particle is heated at melted state, the molten liquid is sucked by a capillary force of gap among ceramic particles around big particles of molten liquid whereby closed pores are formed at a position of big Pb—Zn—B glass particle and a dielectric constant of the circuit board becomes lowered. Accordingly, the magnitude of the pore is possible to control by a magnitude of big glass particle, and the pores of entire circuit board is possible to control by a containing quantity of the big glass particles.

Particularly, in this case, a bending and folding strength of the circuit board is made to be further higher, by alternately piling a green sheet of calcium silicate crystallized glass powder of minute structure and a green sheet of Pb—Zn—B glass powder.

Figure 3:
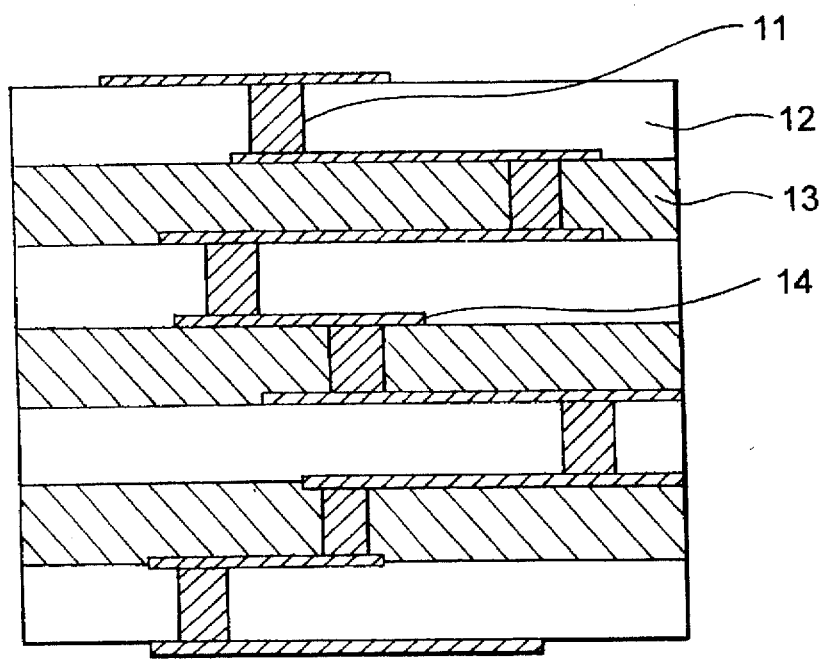
FIG. 3 is a cross sectional facsimile diagram of another multiple layer ceramic circuit board manufactured in accordance with the present invention.

A facsimile diagram of porous multiple layer ceramic circuit board manufactured in accordance with the present invention is shown in FIG. 3.

In FIG. 3, a reference numeral symbol 11 represents through hole, a numeral 12 is minute ceramic insulation layer, a numeral 13 is porous ceramic insulation layer, and a numeral 14 is conductor electrode.

Hereinafter, the present invention will be further concretely explained through examples.

EXAMPLE 1

$Al_2O_3$ ceramic powder and Pb—Zn—B silicate powder were mixed by a mixing ratio as following Table 1. At this moment, as said Pb—Zn—B silicate powder, an article being 15 µm of average granular diameter and an article being 2 µm of average granular diameter were mixed by a mixing ratio as following Table 1.

Next, poly-vinyl-butyral was dissolved into solvent made of dioctyl-phthalate as a major ingredient, a mixed powder mixed as above was uniformly dispersed and then a slurry being 2000 cps of viscosity was prepared.

Next, the slurry manufactured as above was manufactured to A green sheet of 100 µm in thickness by doctor Blade film making method, and then a through hole of 150 µm in diameter was formed at a defined position of A green sheet, and thereafter Ag conductor was injected by a screen printing method, and Ag conductor electrode was printed on sheet surface.

Next, a circuit board printed with Ag conductor electrode as above was piled and then pressure sealed by applying pressure of 2000 psi at 80° C., and then debound at 300° C., and multiple layer ceramic circuit board was manufactured by firing at firing temperature condition as following Table 1.

Material property for multiple layer ceramic circuit board manufactured as above was investigated, and its result was exhibited at following Table 1.

And, SEM photograph for a broken end surface of the circuit board manufactured in accordance with invention Example (2) in following Table 1 is shown in FIG. 4.

On the other hand, contraction quantity in accordance with firing temperature change was measured for invention example (2) of following Table 1, and its result is shown in FIG. 5. In FIG. 5, thickness of the circuit board is 3.750 mm, and the firing was executed in air, and temperature rising speed was 10°C. per minute.

TABLE 1

| | Contents of glass powder and ceramic | | Contents of glass powder and ceramic | | Firing temperature (°C.) | Material property of circuit board | | | |
|---|---|---|---|---|---|---|---|---|---|
| | | | | | | Insulation | Dielectric | Bending & folding | |
| Example No. | Al$_2$O$_3$ powder | Glass powder | Big particle | Small particle | | resistance (Ω) | constant | strength (kgf/cm$^2$) | Comparing |
| Invention | | | | | | | | | |
| 1 | 40 | 60 | 50 | 50 | 750 | >10$^{13}$ | 4 | 1389 | — |
| 2 | 50 | 50 | 40 | 60 | 750 | >10$^{13}$ | 5.5 | 1504 | — |
| 3 | 60 | 40 | 40 | 60 | 750 | >10$^{13}$ | 6.5 | 1614 | — |
| 4 | 70 | 30 | 30 | 70 | 750 | >10$^{13}$ | 6.8 | 1372 | — |
| Comparing example | | | | | | | | | |
| 1 | 20 | 80 | 50 | 50 | 750 | — | — | — | Deformation occurred |
| 2 | 25 | 75 | 50 | 50 | 750 | — | — | — | |
| 3 | 80 | 20 | 50 | 50 | 750 | >10$^{13}$ | 6.4 | <1000 | — |

As shown in above Table 1, it can be seen that in case where the circuit board is manufactured by a condition corresponding to the present invention, the insulation resistance is 10$^{13}$ at examples of invention 1–4, the dielectric constant is less than 6.8, and the bending and folding strength is more than 1372 kgf/cm$^2$ and thereby the material property is excellent, on the contrary, in case of getting out of condition of the invention, deformation is occurred to the circuit board or the bending and folding strength is appeared to less than 1000 kgf/cm$^2$.

And, as shown in FIG. 4, in case of the circuit board manufactured in accordance with the present invention, it is possible to know that big closed pores are uniformly dispersed.

On the other hand, as shown in FIG. 5, it is possible to know that the firing temperature of the present invention is preferable at range of 650°–750° C.

As described above, it is possible to know that when a granularity of the glass powder to be mixed together with ceramic powder is classified into two kinds and a mixing ratio of the powder classified with granularity is adequately adjusted and fired at low temperature, the closed pores of suitable magnitude and quantity are formed within interior without addition of high molecular open gap type raw material, therefore a porous multiple layer ceramic circuit board in which not only an insulation property and wetproof property are excellent but also a dielectric constant is low can be more economically manufactured.

EXAMPLE 2

Al$_2$O$_3$ ceramic powder and Pb—Zn—B silicate powder were mixed by a mixing ratio as following Table 2. At this moment, Pb—Zn—B silicate powder was mixed by a mixing ratio as following Table 2 by using an article having an average granular diameter of two kinds being same as Example 1, and A green sheet was manufactured by a method as example 1.

Next, a calcium silicate being 1.5 μm in diameter was dissolved into said organic solvent together with said organic binder whereby a slurry being 2000 cps in viscosity was prepared, and then B green sheet of 100 μm in thickness was manufactured.

A through hole of 150 μm in diameter was formed at a defined place of respective A and B green sheets manufactured as above, and then Ag conductor was injected by a screen printing method and the conductor electrode was printed on each sheet surface.

After alternately piling the A and B sheets printed as above, pressure heat sealed by applying a pressure of 2000 psi at about 80° C.

After de-binding the sheets being pressure sealed as above at 300° C., fired at a condition of firing temperature as following Table 2 whereby a multiple layer ceramic circuit board was manufactured.

The multiple layer ceramic circuit board manufactured as above was investigated, and its result is illustrated at following Table 2.

Figure 6:
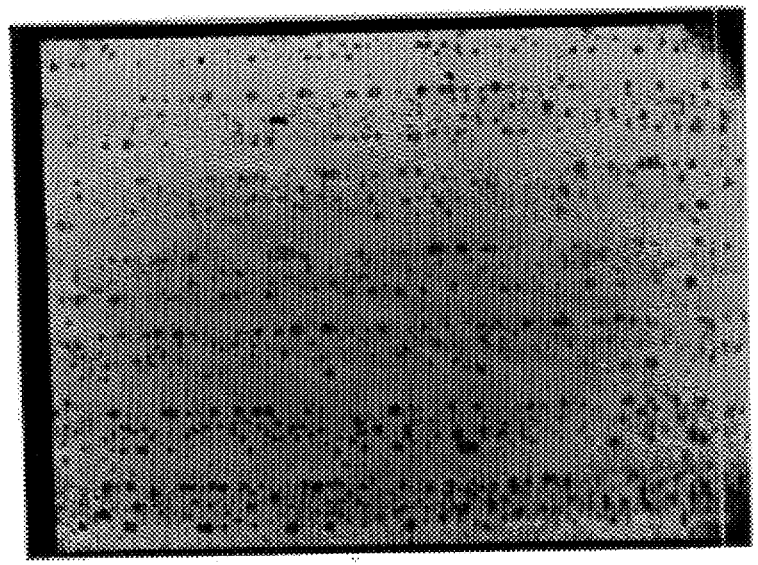
FIG. 6 is a graph illustrating a contraction rate change in response to firing temperature change of the circuit board used A green sheet only.

And, an optical microscopic photograph for a broken end surface of the circuit board manufactured in accordance with the invention example (7) in following Table 2 is illustrated in FIG. 6.

Figure 7:
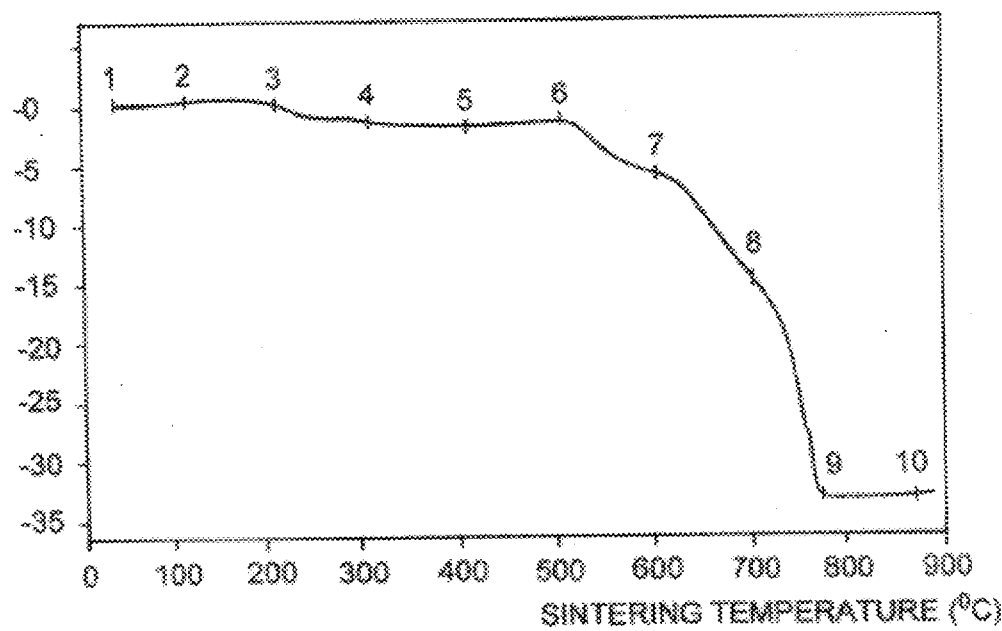
FIG. 7 is a graph illustrating a contraction rate change in response to firing temperature change of the circuit used A/B green sheet.

On the other hand, a contraction rate change in response to firing temperature change was measured for the invention Example (7) of following Table 2, and its result was illustrated in FIG. 7. In FIG. 7, the firing was executed in air, and a temperature rising speed was 10° C. per minute.

TABLE 2

| | Contents of glass | | | | | Material property of circuit board | | |
| --- | --- | --- | --- | --- | --- | --- | --- | --- |
| | Contents of glass powder and ceramic | | powder and ceramic | | Firing temper- | Insula- tion | Dielec- tric | Bending & folding strength |
| Example No. | $Al_2O_3$ powder | Glass powder | Big particle | Small particle | ature (°C.) | resist- ance (Ω) | constant | (kgf/cm$^2$) |
| Invention | | | | | | | | |
| 5 | 30 | 70 | 50 | 50 | 800 | $>10^{13}$ | 4.5 | 1860 |
| 6 | 40 | 60 | 50 | 50 | 800 | $>10^{13}$ | 6.0 | 1880 |
| 7 | 50 | 50 | 40 | 60 | 850 | $>10^{13}$ | 6.5 | 2280 |
| 8 | 60 | 40 | 40 | 60 | 850 | $>10^{13}$ | 6.2 | 1729 |
| 9 | 70 | 30 | 30 | 70 | 850 | $>10^{13}$ | 7.0 | 1720 |
| Comparing example | | | | | | | | |
| 4 | 20 | 80 | 50 | 50 | 850 | $>10^{13}$ | 6.4 | <1300 |
| 5 | 25 | 75 | 50 | 50 | 850 | $>10^{13}$ | 6.4 | <1300 |
| 6 | 80 | 20 | 50 | 50 | 850 | $>10^{13}$ | 8.0 | <1300 |

As illustrated in above table, it can be seen that in case where the circuit board is manufactured by a condition corresponding to the present invention, the insulation resistance is $10^{13}$ at examples of invention 5–9, the dielectric constant is less than 7.0, and the bending and folding strength is more than 1720 kgf/cm$^2$ and thereby the material property is excellent, on the contrary, in case of getting out of condition of the invention, the bending and folding strength is less than 1300 kgf/cm$^2$ in comparing examples 4–6 whereby it is low, and in case of comparing Example 6, the dielectric constant is appeared as 8.0.

And, as illustrated in FIG. 6, in case of the circuit board manufactured in accordance with the present invention, it is possible to know that porous layers uniformly dispersed with big closed pores and minute layers are piled.

On the other hand, as shown in FIG. 7, it is possible to know that the firing temperature of the present invention is preferable at about 750°–900° C.

As described above, it is possible to know that a multiple layer ceramic circuit board can be more economically manufactured in case of a method in which a granularity of Pb—Zn—B glass powder mixed together with ceramic powder is classified into two kinds, A green sheet pertinently adjusted with mixing ratio of powder classified with granularity and B green sheet using calcium silicate crystallized glass powder are manufactured and then above two green sheets are alternately piled and thereafter fired at low temperature, closed pores of suitable magnitude and quantity are formed within interior without addition of high molecular open gap type raw material whereby an insulation property and wetproof property are excellent and not only dielectric constant is low but also particularly the bending and folding strength is excellent.

What is claimed is:

1. A method for manufacturing multiple layer ceramic circuit board comprising:

a step for mixing 30–70 wt % of Pb—Zn—B glass powder made of 50–90 wt % of a powder being 9–20 μm of average granular diameter and 10–50 wt % of a powder of less than 3 μm of average granular diameter, and 30–70 wt % of ceramic powder;

a step for manufacturing slurry of less than 3000 cps in viscosity by uniformly dispersing the mixture mixed as above and an organic binder into solvent;

a step for forming a green sheet by casting said slurry;

a step for forming a though hole at a predetermined position of said green sheet and then, injecting a conductor electrode, and printing a conductor electrode on sheet surface;

a step for pressure heat-sealing after piling a circuit board printed with conductor electrode; and a step for firing at 650°–750° C. after de-binding the heat-sealed sheet.

2. A method for manufacturing multiple layer ceramic circuit board as defined in claim 1, wherein said Pb—Zn—B glass powder is made by 30–50 wt % of powder being 9–20 μm in average diameter, and 50–70 wt % of powder being less than 3 μm in average diameter.

3. A method for manufacturing multiple layer ceramic circuit board as defined in claim 1, wherein said ceramic powder is $Al_2O_3$.

4. A method for manufacturing multiple layer ceramic circuit board as defined in claim 1, wherein said organic binder is a kind selected from a group made by PVA, PVB and acryl resin.

5. A method for manufacturing multiple layer ceramic circuit board as defined in claim 1, wherein said circuit board is $10^{13}$ ohms in insulation resistance, and less than 6.8 in dielectric constant.

6. A method for manufacturing multiple layer ceramic circuit board comprising:

a step for mixing 30–70 wt % of Pb—Zn—B glass powder made of 50–90 wt % of a powder being 9–20 μm of average granular diameter and 10–50 wt % of a powder of less than 3 μm of average granular diameter, and 30–70 wt % of ceramic powder;

a step for manufacturing slurry of less than 3000 cps in viscosity by uniformly dispersing the mixture mixed as above and an organic binder into solvent;

a step for forming a green sheet by casting said slurry;

a step for forming a green sheet by mixing Pb—Zn—B glass powder and ceramic powder as above, and then forming a through hole at a predetermined position of said green sheet;

a step for manufacturing a slurry less than 3000 cps in viscosity by uniformly dispersing calcium silicate crystallized glass powder and glass binder into solvent, and then forming a green sheet as above, and forming a through hole at a predetermined position of the green sheet;

a step for injecting a conductor electrode to each through hole formed as above, and printing the conductor electrode on each sheet surface;

a step for alternately piling the sheets printed with conductor electrode as above; and a step for de-binding the sheet being pressure heat-sealed as above and then fired at 750°–900° C.

7. A method for manufacturing multiple layer ceramic circuit board as defined in claim 6, wherein said organic binder is a kind selected from a group made by PVA, PVB and acryl resin.

8. A method for manufacturing multiple layer ceramic circuit board as defined in claim 6, wherein said circuit board contains 10–40 wt % in an isolated pore rate being 5–30 μm in its diameter.

9. A method for manufacturing multiple layer ceramic circuit board as defined in claim 4, wherein said circuit board is $10^{13}$ ohms in insulation resistance, and less than 6.8 in dielectric constant.

10. A method for manufacturing multiple layer ceramic circuit board as defined in claim 6, wherein said circuit board is more than $10_{13}$ ohms in insulation resistance, 7.0 in dielectric constant, and at least 1720 kgf/cm² in bending and folding strength.

11. A method for manufacturing multiple layer ceramic circuit board as defined in claim 2, wherein said circuit board is $10^{13}$ ohms in insulation resistance, and less than 6.8 in dielectric constant.

12. A method for manufacturing multiple layer ceramic circuit board as defined in claim 3, wherein said circuit board is $10^{13}$ ohms in insulation resistance, and less than 6.8 in dielectric constant.

* * * * *